US011477892B2

(12) United States Patent
Harris et al.

(10) Patent No.: US 11,477,892 B2
(45) Date of Patent: Oct. 18, 2022

(54) PCB STRUCTURE FOR EMBEDDING ELECTRONIC COMPONENTS

(71) Applicant: UNIVERSITY OF LIMERICK, Limerick (IE)

(72) Inventors: John Harris, Keenagh (IE); Jennifer Hennessy, Cratloe (IE); Seamus Clifford, Nenagh (IE); Mark Southern, Limerick (IE)

(73) Assignee: UNIVERSITY OF LIMERICK, Limerick (IE)

( * ) Notice: Subject to any disclaimer, the term of this patent is extended or adjusted under 35 U.S.C. 154(b) by 35 days.

(21) Appl. No.: 17/051,723

(22) PCT Filed: May 2, 2019

(86) PCT No.: PCT/EP2019/061305
§ 371 (c)(1),
(2) Date: Oct. 29, 2020

(87) PCT Pub. No.: WO2019/211406
PCT Pub. Date: Nov. 7, 2019

(65) Prior Publication Data
US 2021/0243899 A1    Aug. 5, 2021

(30) Foreign Application Priority Data

May 3, 2018 (EP) .................................. 18170629

(51) Int. Cl.
*H05K 3/04* (2006.01)
*H05K 1/11* (2006.01)
(Continued)

(52) U.S. Cl.
CPC ............... *H05K 3/04* (2013.01); *H05K 1/115* (2013.01); *H05K 1/16* (2013.01); *H05K 3/0047* (2013.01);
(Continued)

(58) Field of Classification Search
CPC .......... H05K 1/115; H05K 1/16; H05K 1/167; H05K 1/162; H05K 1/0256; H05K 1/0298;
(Continued)

(56) References Cited

U.S. PATENT DOCUMENTS 8,064,214 B2 * 11/2011 Frasco ................... H05K 1/184
361/761
8,158,892 B2 * 4/2012 Goergen ................ H05K 3/429
174/250

(Continued)

OTHER PUBLICATIONS

PCT/EP2019/061305. International Search Report & Written Opinion. (dated Sep. 2, 2019).

*Primary Examiner* — Hoa C Nguyen
*Assistant Examiner* — John B Freal
(74) *Attorney, Agent, or Firm* — Loza & Loza, LLP; Anthony Smyth

(57) ABSTRACT

A PCB, printed circuit board, structure for forming at least one embedded electronic component. The structure comprises a multi-layer PCB board comprising at least one through-hole via, the via comprising a plurality of electrodes vertically aligned within the via, each electrode comprising a plated ring; and an isolation section separating each of the electrodes.

16 Claims, 5 Drawing Sheets

(51) Int. Cl.
*H05K 1/16* (2006.01)
*H05K 3/00* (2006.01)
*H05K 3/42* (2006.01)

(52) U.S. Cl.
CPC ............ *H05K 3/429* (2013.01); *H05K 1/162* (2013.01); *H05K 1/167* (2013.01); *H05K 2201/09845* (2013.01); *H05K 2201/10083* (2013.01); *H05K 2201/10121* (2013.01); *H05K 2201/10151* (2013.01); *H05K 2201/10196* (2013.01)

(58) Field of Classification Search
CPC ............ H05K 1/14; H05K 1/144; H05K 1/18; H05K 1/0274; H05K 1/0236; H05K 2201/01; H05K 2201/096; H05K 2201/09645; H05K 2201/09845; H05K 2201/09981; H05K 2201/10083; H05K 2201/10121; H05K 2201/10151; H05K 2201/10196
See application file for complete search history.

(56) References Cited

U.S. PATENT DOCUMENTS

| | | | |
|---|---|---|---|
| 2004/0118605 A1* | 6/2004 | van der Laan | H05K 3/429 174/262 |
| 2006/0049913 A1 | 3/2006 | Kang et al. | |
| 2006/0082984 A1* | 4/2006 | Wu | H05K 1/115 174/262 |
| 2006/0203457 A1* | 9/2006 | Busletta | H05K 1/16 361/761 |
| 2008/0052904 A1 | 3/2008 | Schneider et al. | |
| 2017/0231099 A1 | 8/2017 | Mundt et al. | |

* cited by examiner

PCB STRUCTURE FOR EMBEDDING ELECTRONIC COMPONENTS

CLAIM OF PRIORITY

This application is the U.S. National Stage of International Patent Application No. PCT/EP2019/061305 filed May 2, 2019, which claims priority to European Patent Application No. 18170629.2 filed May 3, 2018, both of which applications are incorporated herein by reference in their entirety.

FIELD

The present invention relates to a PCB structure for forming embedded electronic components. More particularly, the invention relates to a PCB structure for vertically embedding electronic components, as well as a method for fabricating such a PCB structure.

BACKGROUND

A Printed Circuit Board (PCB) consists of at least one PCB substrate comprising an insulating layer of a dielectric material which is clad on one or both sides with a patterned conductive layer, which typically takes the form of copper traces. A double-sided PCB comprises a single insulating layer with a conductive layer clad on each side of the insulating layer. The electrical connection between the conductive layers on each side of the insulating layer of a double-sided PCB is provided by means of plated through holes or vias in the insulating layer, where the plating is a conductive material such as copper. A multi-layer PCB is typically fabricated by stacking and 'gluing' together a plurality of double-sided PCBs. After the copper traces are patterned on the each of the plurality of double-sided PCBs, a prepreg is used to fill around the copper traces and electrically separate each internal double-sided PCB in the multi-layer PCB stack, while at the same time binding respective double-sided PCBs together.

One type of PCB assembly comprises a multi-layer board containing passive electronic components and/or active electronic components located on one or more of the conductive layers, with the components on a conductive layer being connected to each other by means of soldering onto the copper traces of the conductive layers. In most applications, the passive and active electronic components are located on the top and/or on the bottom conductive layers of the PCB. However, in some specialist applications, these components are also located on the internal conductive layers of the PCB.

An electronic passive component may take the form of a discrete element or an embedded element. Embedded passive elements in a PCB are typically fabricated through the use of particular layer materials to form the relevant structures, such as for example resistive or dielectric inks or pastes. The fabrication process can use various printing techniques to create these elements, such as for example screen-printing.

In the past, embedded passive components were often incorporated into a PCB in order to save space on the board. However, this requirement has largely been made redundant by the advent of very small discrete passive components. Nevertheless, embedded passive components are still beneficial in many applications, for example in order to reduce parasitic effects and for providing high-density series termination resistors for transmission lines in ball-grid array (BGA) microprocessor and memory devices.

Embedded passive components are typically embedded in a PCB using planar topologies. An alternative approach for embedding passive components in a PCB uses electroless plating to cap the top and bottom of an insulated via that can be filled with an electrical material.

US Patent Application Publication No. US 2006/0203457 describes a printed wiring board (PWB) which comprises multiple insulating layers located between conductive layers. A via in the PWB is deposited with plating, with the plating then partially removed to electrically disconnect a first group of conductive layers from a second group of conductive layers. An electrical device is positioned within the partially plated via to electrically connect at least a portion of the conductive layers to each other. The electrical device may be any type of electrical device conventionally found on PWBs, such as those used to form power converters.

U.S. Pat. No. 7,364,461 describes a process for connecting a coaxial cable to a printed circuit board assembly in a manner that establishes an electrical connection between the coaxial cable and the assembly. This involves applying a conductive layer to a top and bottom surface of a first layer and the bottom surface of a second layer of an assembly, with an aperture being formed through the first layer. A signal via and one or more shield vias are then formed in the assembly and covered with a conductive layer, with the signal via being electrically separated from the shield vias and the aperture. A stripped coaxial cable can then be inserted into the aperture so that the conductive core of the coaxial cable is electrically connected to the signal via but electrically isolated from the shield vias and aperture.

It is an object of the present invention to provide a new PCB structure for forming embedded passive components and circuits, as well as a process technology to fabricate same.

SUMMARY

According to a first aspect of the invention there is provided, as set out in the appended claims, a PCB structure for forming at least one embedded printed electronic component comprising:

a multi-layer PCB board comprising at least one through-hole via comprising an inner wall, the via comprising:

a plurality of electrodes vertically aligned within the via, each electrode comprising a plated ring; and an isolation section separating each of the electrodes, wherein the inner wall of the via is provided with a coating of one or more electronically active materials, such that each electronically active material makes electrical contact with at least two electrodes of the plurality of electrodes to form the at least one embedded printed electronic component.

In one embodiment, the through-hole via comprises one or more stepped-holes.

In one embodiment, the via is filled with one or more electronically active materials, such that each electronically active material makes electrical contact with at least two electrodes of the plurality of electrodes to form the at least one embedded electronic component.

In one embodiment, the via is partially filled with the one or more electronically active materials.

In one embodiment, the inner wall of the via is coated with one or more electronically active materials, such that each electronically active material makes electrical contact with at least two electrodes of the plurality of electrodes to form the at least one embedded electronic component.

In one embodiment, the via is partially coated with the one or more electronically active materials.

In one embodiment, the one or more electronically active materials comprises one or more of: a conductor, a semiconductor and a dielectric.

In one embodiment, the one or more electronically active materials comprise materials whose properties change due to a physical stimulus.

In one embodiment, the properties comprise electrical, electronic, optical or physical properties.

In one embodiment, the one or more electronically active materials comprise materials whose physical state changes due to an electrical stimulus.

In one embodiment, the one or more electronically active materials comprise one or more of: piezoelectric materials, magnetic materials, photo-luminescent materials and phase-change materials.

In one embodiment, each of the one or more electronically active materials takes the form of an ink, a paste, a resin, or an adhesive.

In one embodiment, the thickness of the coating of the one or more electronically active materials is less than the radius of the via.

In another aspect of the invention there is provided a method of fabricating a PCB structure for embedding at least one printed electronic component, the method comprising:

forming a multi-layer PCB, printed circuit board, comprising:

an upper PCB section, a lower PCB section, and an intermediate PCB section between the upper PCB section and the lower PCB section;

boring a through-hole of a first diameter in the multi-layer PCB;

counter-boring a hole of a second diameter from the hole in the lower PCB section to a height marginally greater than the lower PCB section and/or counter-boring a hole of the second diameter from the hole in the upper PCB section to a depth marginally greater than the upper PCB section, wherein the second diameter is greater than the first diameter; plating the inner wall of the bored hole to form a via; and selectively removing at least one band of plating from the via so as to create a plurality of vertically aligned electrodes within the via, each electrode comprising a plated ring, and each electrode separated by an isolation section;

wherein the step of selectively removing at least one band of plating from the via comprises:

back-drilling a hole of a third diameter from at least one counter-bored via to at least one predetermined depth of the PCB, wherein the third diameter is greater than the first diameter and less that the second diameter, and wherein the method further comprises the step of coating the inner wall of the via with one or more electronically active materials such that each electronically active material makes electrical contact with at least two electrodes of the plurality of electrodes to form the at least one embedded printed electronic component.

In one embodiment, the method further comprises performing in a single step the steps of:

boring the through-hole of the first diameter in the multi-layer PCB; and counter-boring the hole of the second diameter from the hole in the lower PCB section or from the hole in the upper PCB section.

In one embodiment, the steps of boring the through-hole of the first diameter in the multi-layer PCB and counter-boring the hole of the second diameter from the hole in the lower PCB section or from the hole in the upper PCB section is performed by a stepped drill bit.

In one embodiment, the via in the lower PCB section is counter-bored, and the method further comprises performing the back-drilling of the hole of the third diameter from the counter-bored via in the lower PCB section, wherein the back-drilling comprises back-drilling to a height marginally less than the upper PCB section.

In one embodiment, the via in the upper PCB section is counter-bored, and the method further comprises performing the back-drilling of the hole of the third diameter from the counter-bored via in the upper PCB section, wherein the back-drilling comprises back-drilling to a depth marginally less than the lower PCB section.

In one embodiment, the via in the upper PCB section is counter-bored and the via in the lower PCB section is counter-bored, and the method further comprises performing the back-drilling of the hole of the third diameter from the counter-bored via in the upper PCB section and from the counter-bored via in the lower PCB section, wherein the back-drilling comprises back-drilling to a plurality of predetermined depths of the PCB.

In one embodiment, the method further comprises the step of filling the via with one or more electronically active materials such that each electronically active material makes electrical contact with at least two electrodes of the plurality of electrodes to form the at least one embedded electronic component.

In one embodiment, the method further comprises partially filling the via with the one or more electronically active materials.

In one embodiment, the method further comprises the step of coating the via with one or more electronically active materials such that each electronically active material makes electrical contact with at least two electrodes of the plurality of electrodes to form the at least one embedded electronic component.

In one embodiment, the method further comprises partially coating the via with the one or more electronically active materials.

In one embodiment, the method further comprises the one or more electronically active materials that comprise one or more of: a conductor, a semiconductor or a dielectric.

In one embodiment, each of the one or more electronically active materials take the form of an ink, a paste, a resin, or an adhesive.

In one embodiment, each of the upper PCB section, the lower PCB section and the intermediate PCB section comprise a plurality of conductive layers, with each layer separated by an insulating layer in the form of a PCB substrate or a prepreg layer.

In one embodiment, the one or more electronically active materials comprise one or more of: a conductor, a semiconductor and a dielectric.

In one embodiment, the one or more electronically active materials comprise materials whose properties change due to a physical stimulus.

In one embodiment, the properties comprise electrical, electronic, optical or physical properties.

In one embodiment, the one or more electronically active materials comprise materials whose physical state changes due to an electrical stimulus.

In one embodiment, the one or more electronically active materials comprise one or more of: piezoelectric materials, magnetic materials, photo-luminescent materials and phase-change materials.

In one embodiment, the thickness of the coating of the one or more electronically active materials is less than the radius of the via.

In another aspect of the invention there is provided, a PCB structure for forming at least one embedded electronic component comprising:

a multi-layer PCB board comprising at least one through-hole via, the via comprising: a plurality of electrodes vertically aligned within the via, each electrode comprising a plated ring; and an isolation section separating each of the electrodes.

In another aspect of the invention there is provided a method of fabricating a PCB structure for embedding at least one electronic component, the method comprising: forming a multi-layer PCB, printed circuit board, comprising:

an upper PCB section, a lower PCB section, and an intermediate PCB section between the upper PCB section and the lower PCB section;

boring a through-hole of a first diameter in the multi-layer PCB;

counter-boring a hole of a second diameter from the hole in the lower PCB section to a height marginally greater than the lower PCB section and/or counter-boring a hole of the second diameter from the hole in the upper PCB section to a depth marginally greater than the upper PCB section, wherein the second diameter is greater than the first diameter;

plating the inner wall of the bored hole to form a via; and selectively removing at least one band of plating from the via so as to create a plurality of vertically aligned electrodes within the via, each electrode comprising a plated ring, and each electrode separated by an isolation section;

wherein the step of selectively removing at least one band of plating from the via comprises:

back-drilling a hole of a third diameter from at least one counter-bored via to at least one predetermined depth of the PCB, wherein the third diameter is greater than the first diameter and less that the second diameter.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION OF THE DRAWINGS

Figure 1:
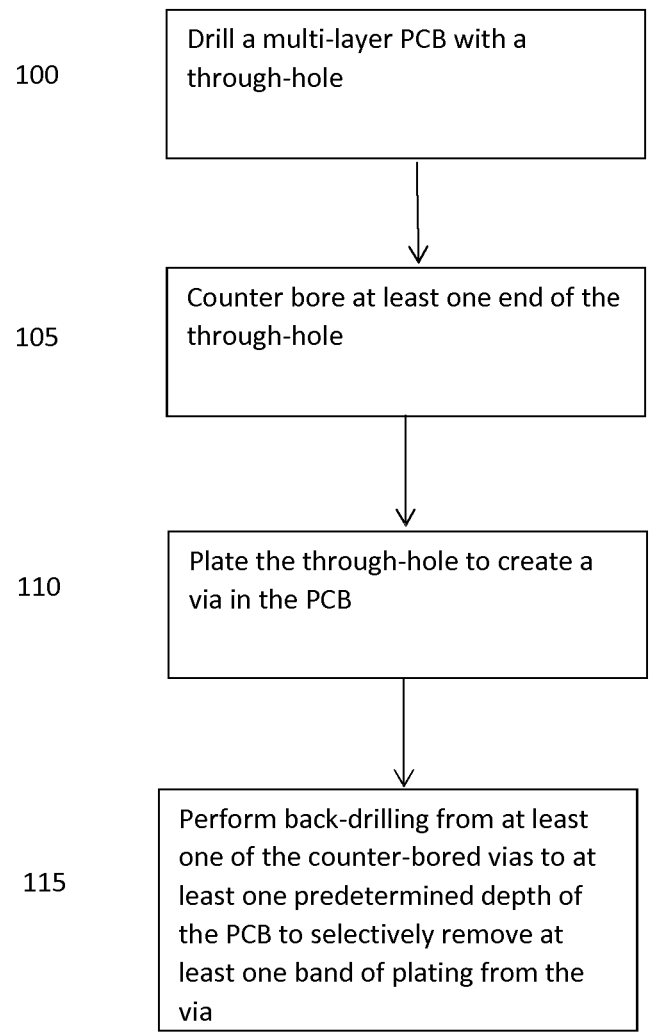
FIG. 1 outlines the main process steps in the fabrication of the PCB structure of the present invention.

The present invention provides a PCB structure as set out in the appended claims for embedding at least one electronic component which comprises a plurality of electrodes in the form of plated rings that are vertically-aligned in a multi-layer PCB via and electrically separated by one or more isolation sections. The via may then be filled or coated with one or more electronically active materials such that each electronically active material makes electrical contact with at least two electrodes of the plurality of electrodes to form at least one embedded electronic component.

The electronic properties of the electronically active materials are chosen to provide the desired type of embedded passive device in the PCB structure, such as for example a conductor, a semiconductor or a dielectric. The via can be partially or fully filled or its walls can be partially or fully coated with the chosen one or more electronically active materials through any suitable means, such as for example through the use of ink, paste, resin or adhesive.

In one embodiment of the invention, the fabrication of the PCB structure of the present invention involves the use of a back-drilling process on a plated through-hole or via in a multi-layer PCB. The back-drilling is used to selectively remove one or more sections of the plating of a via at controlled depths, so that upon removal of the plating from a section or band of a via, the section becomes an isolation section, with each remaining plated section of the via forming a plated ring. The number of sections of plating of the internal wall of a via which are removed is determined by the one or more types of embedded electronic components which are to be formed in the PCB structure.

For example, in one embodiment of the invention, back-drilling is used to remove a single band or section of the internal plating of a via so as to create a pair of electrodes in the via comprising a first plated ring and a second plated ring which are vertically spaced apart in the PCB and separated by an isolation section.

In another embodiment of this invention, three electrodes can be created in a via by back-drilling to specific depths from either side of the PCB via so as to form three plated rings, each plated ring separated by an isolation section. It will thus be appreciated that any number of electrodes can be created in the PCB via by removing additional bands of the copper plating on the internal wall of the via through back-drilling.

One or more vertical embedded electronic components can then be formed in this PCB structure by partially or fully filling or coating the via with one or more electronically active materials such that each electronically active material makes electrical contact with at least two of the electrodes. Each electrode can also be connected to the traces of the conductive layers of the multi-layer PCB. Thus, it is possible to realise embedded circuits by using the internal electrodes. It should be understood that the thickness of the coating of the one or more electronically active materials is less than the radius of the via, such that the via still exists as a through-hole.

Examples of suitable electronically active materials include polymer-metal composites (conductor, semiconductor or resistor), polymer-(nano)carbon composites (conductor, semiconductor or resistor), polymer-dielectric composites (capacitor or resistor) and polymer-resistive ceramic composites (resistor). Further examples of electronically active materials are those materials whose electronic properties change due to a physical stimulus or materials whose physical state changes due to an electrical stimulus. These include piezoelectric materials, magnetic materials and photo-luminescent materials.

FIG. 1 outlines the main process steps of one embodiment of the fabrication process of the PCB structure of the present invention. In step 100, a multi-layer PCB comprising an upper PCB section, a lower PCB section and an intermediate PCB section is drilled with a through-hole of a first diameter. In step 105, at least one end of the through-hole in the multi-layer PCB is counter-bored with a hole of a second diameter to create a stepped-diameter hole, where the second diameter is greater than the first diameter. This involves counter-boring a hole of the second diameter in the lower PCB section to a height marginally greater than the lower PCB section and/or counter-boring a hole of the second diameter from the hole in the upper PCB section to a depth marginally greater than the upper PCB section. If one end of the through-hole is counter-bored, a single stepped-diameter hole is created. If both ends of the through-hole are counter-bored, a double stepped-diameter hole is created. In step 110, the stepped-diameter hole is plated with a conductive material to create a via (typically copper). In step 115, back-drilling of a hole of a third diameter is performed from at least one counter-bored via to at least one predetermined depth of the PCB in order to selectively remove at least one band of plating from the via, wherein the third diameter is greater than the first diameter and less that the second diameter. This results in the creation of a plurality of electrodes in the form of plated rings within the via, with each electrode being separated by an isolation section, corresponding to those sections where the via was back-drilled. For example, if only the via in the lower PCB section is counter-bored in step 105, step 115 involves back-drilling a hole of the third diameter from the counter-bored via in the lower PCB section to a height marginally less than the upper PCB section. Alternatively, if only the via in the upper PCB section is counter-bored in step 105, step 115 involves back-drilling a hole of the third diameter from the counter-bored via in the upper PCB section to a depth marginally less than the lower PCB section. If both the via in the upper PCB section and the via in the lower PCB section is counter-bored in step 105, step 115 involves back-drilling a hole of the third diameter from the counter-bored via in the upper PCB section and from the counter-bored via in the lower PCB section to a plurality of predetermined depths of the PCB.

It will be appreciated that the diameter of each of the first, second and third holes will depend on the application in which the PCB structure of the present invention is to be used. For example, in one embodiment of the invention, the first diameter is 0.8 mm, the second diameter is 1 mm and the third diameter is 0.85 mm.

It will be appreciated that the drilling and the counter-boring which are described above as being performed as two sequential steps could alternatively be performed in a single step through the use of a stepped drill bit. In this case, the stepped drill bit comprises a drill bit tip proximal section of a first diameter and a drill bit tip distal section of a second diameter, wherein the second diameter is greater than the first diameter. The first diameter of the drill-bit then forms the initial through-hole in the multi-layer PCB, while the second diameter of the drill-bit provides for the counter boring of the through-hole in order to form the stepped-diameter hole.

A stepped drill bit can also be used for the back-drilling process when three or more electrodes are to be created in the via. This enables the removal of a plurality of bands of the plating of the via by selective grinding away or otherwise. For example, in the case where it is desired to create three electrodes in the via, the method can involve the use of two different stepped drill bits, where the first stepped drill bit is used to perform the boring and counter boring in a single step, and the second stepped drill bit is used to perform the back drilling. The first stepped drill bit comprises a drill bit tip proximal section, a drill bit tip distal section, and a section intermediate the drill bit tip proximal section and the drill bit tip distal section. The drill bit tip proximal section is of a first diameter, while the intermediate section is of a second diameter greater than the first diameter. The drill bit tip distal section is of a third diameter greater than the second diameter. The second stepped drill bit comprises a drill bit tip proximal section of a fourth diameter and a drill bit tip distal section of a fifth diameter. The fourth diameter is greater than the first diameter but less than the second diameter and the fifth diameter is greater than the second diameter but less than the third diameter.

Figure 2:
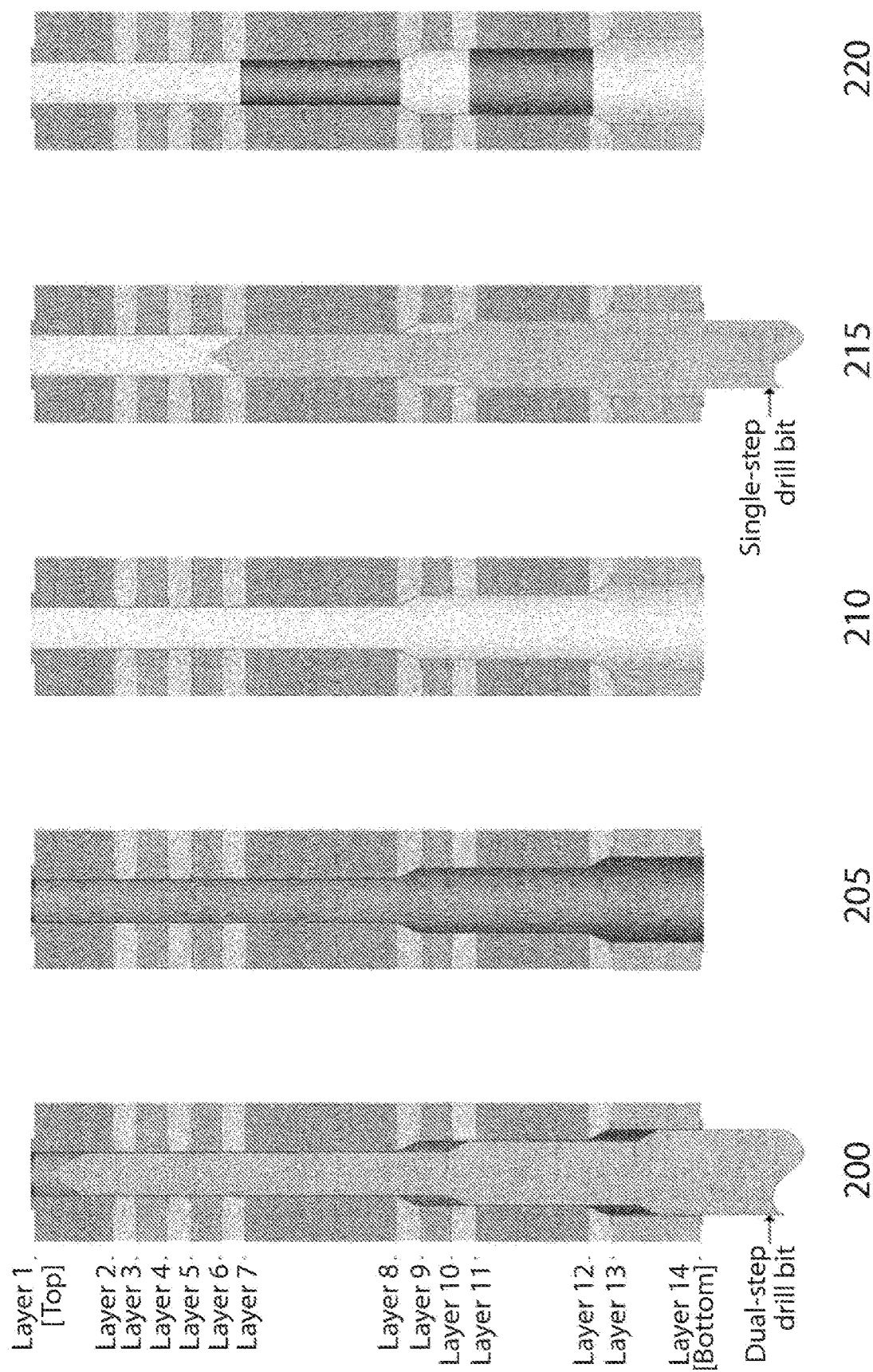
FIG. 2 illustrates the main steps in forming a PCB structure of the present invention comprising three electrodes using two different stepped drill bits.

FIG. 2 illustrates how a PCB structure having three electrodes could be created with these two stepped drilled bits. In step 200, the steps of boring and counter-boring are performed simultaneously using the first stepped drill bit. This results in a counter-bored hole having two internal steps (step 205). After the counter-bored hole is plated in step 210, the second stepped drill bit is used to remove two bands of the plating of the via by back-drilling the counter-bored hole (step 215). The resultant PCB structure then comprises three electrodes, one of which is an internal electrode, as shown in step 220. It should further be appreciated that the same drilling sequence could also be applied from the other end of the PCB if it were desired to double the number of electrodes in the PCB structure.

Figure 3A:
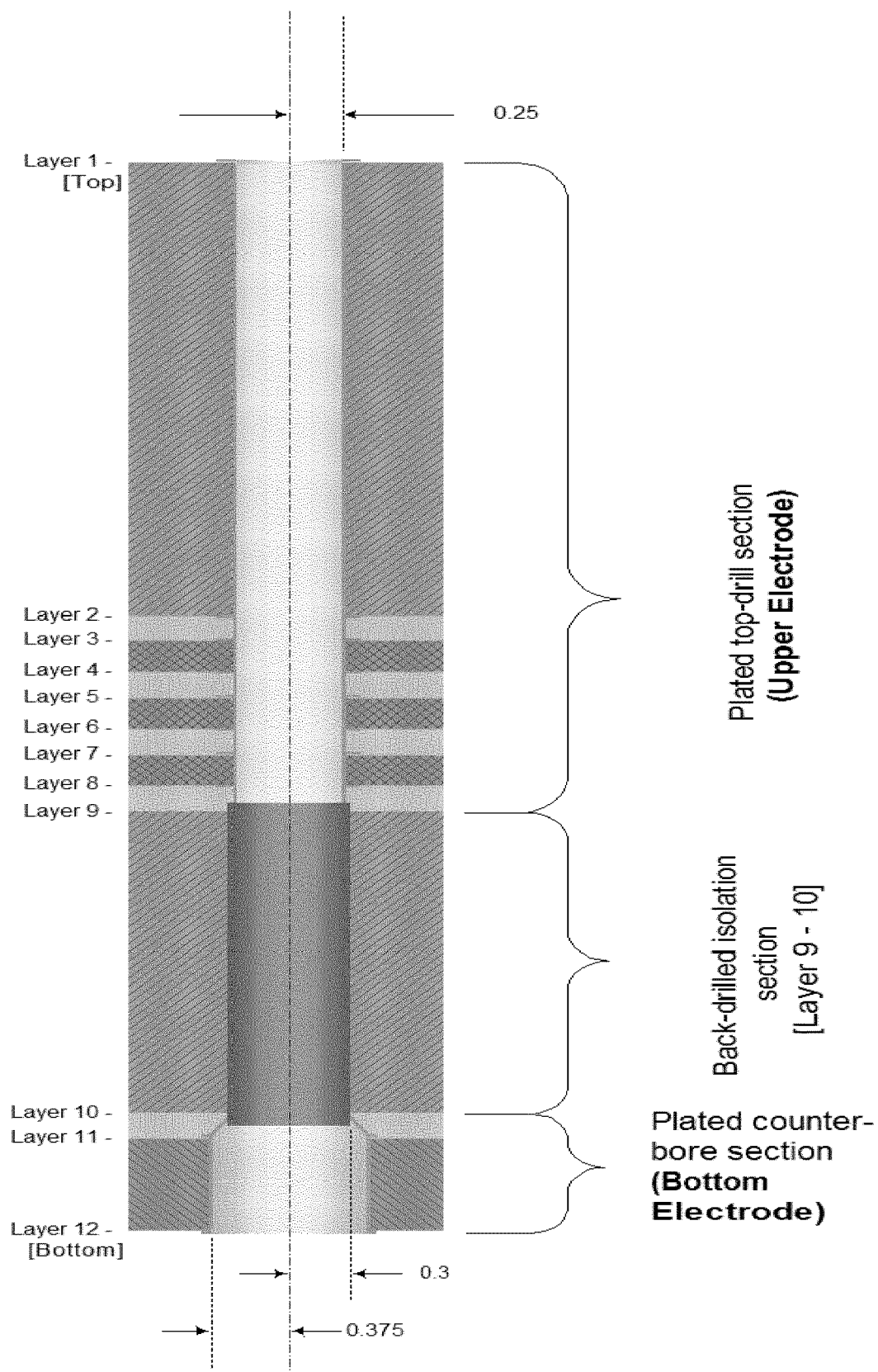
FIG. 3a shows a cross-section of one embodiment of the PCB structure of the present invention where the PCB structure comprises a single stepped PCB via with two electrodes vertically aligned in the via.

FIG. 3a shows a cross-section of one embodiment of the PCB structure of the present invention fabricated from a multi-layer PCB comprising twelve layers, with each layer separated by an insulating layer in the form of a PCB substrate or a prepreg layer, where the PCB structure comprises a single stepped via comprising two electrodes separated by an isolation section. In the embodiment shown in this figure, an annular ring is included on each of the PCB layers. The inclusion of an annular ring on one or more of the layers provides mechanical anchorage to the plating on the sidewalls of the via, in order to minimise the risk of the plating tearing during back-drilling.

Figure 3B:
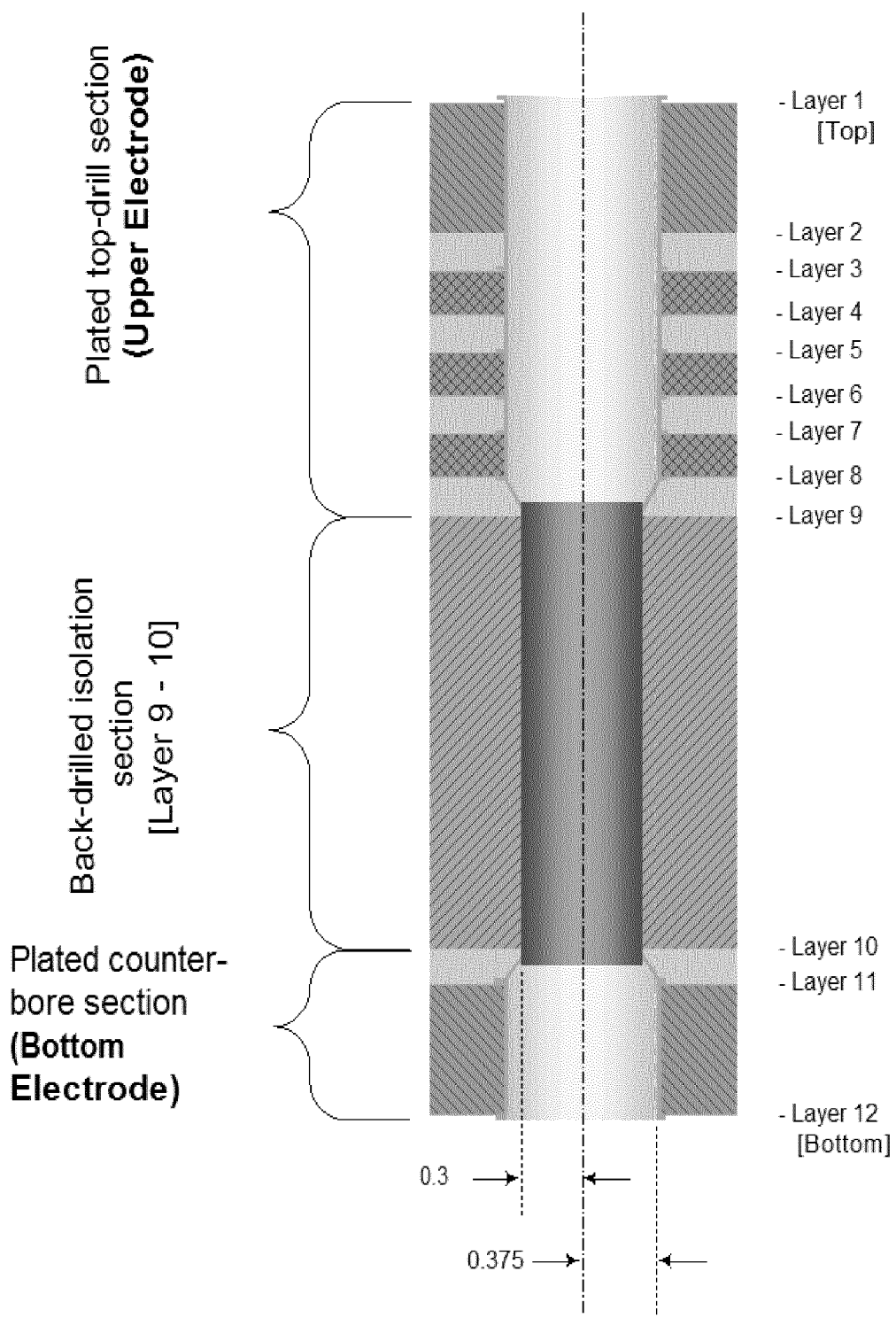
FIG. 3b shows a cross-section of another embodiment of the PCB structure of the present invention where the PCB structure comprises a double stepped PCB via with two electrodes vertically aligned in the via.

FIG. 3b shows a cross-section of another embodiment of the PCB structure of the present invention fabricated using a multi-layer PCB of the same structure as shown in FIG. 3a, but where the PCB structure comprises a double stepped via, and which comprises two electrodes separated by an isolation section. In the embodiments of both FIG. 3a and FIG. 3b, the upper electrode of the two electrodes spans between conductive layer 1 and conductive layer 8 of the PCB, while the lower electrode spans between conductive layer 11 and conductive layer 12. The isolation section formed by back-drilling then spans between layers 9 and 10.

Figure 4:
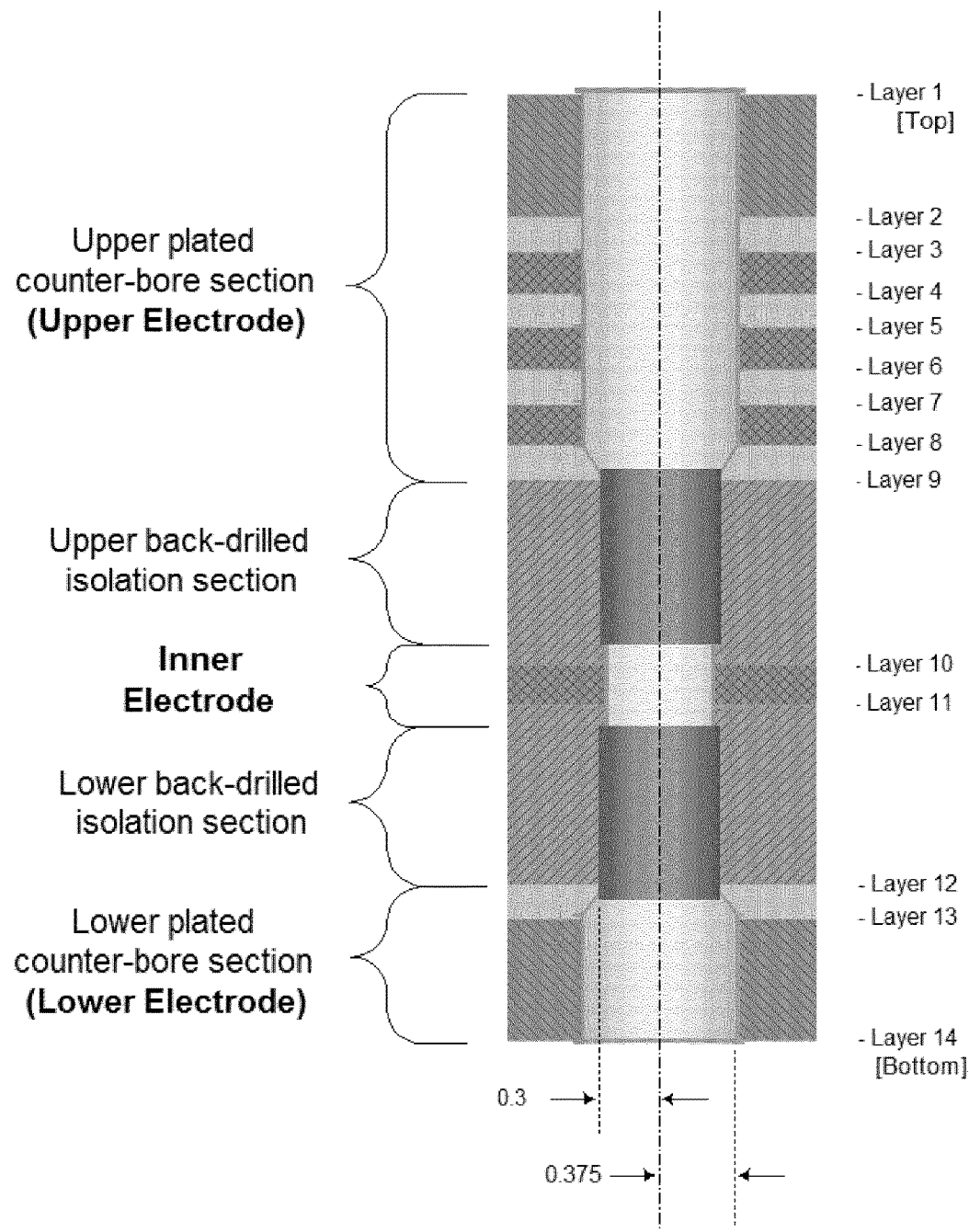
FIG. 4 shows a cross-section of yet another embodiment of the PCB structure of the present invention where the PCB structure comprises a double stepped PCB via with three electrodes vertically aligned in the via.

FIG. 4 shows a cross-section of yet another embodiment of the PCB structure of the present invention fabricated from a multi-layer PCB comprising fourteen layers, where the PCB structure comprises a double stepped via comprising three electrodes, with each electrode separated by an isolation section. In the embodiment of FIG. 4, the upper electrode of the three electrodes spans between conductive layer 1 and conductive layer 8 of the PCB, the lower electrode spans between conductive layer 13 and conductive layer 14, and the inner electrode spans between conductive layer 10 and conductive layer 11. The first isolation section between the upper electrode and the inner electrode spans between layer 9 and layer 10, while the second isolation section between the inner electrode and the lower electrode spans between layer 11 and layer 12.

It will be appreciated that in FIGS. 3 and 4 the vias have yet to be fully or partially filled or coated with one or more electronically active materials so as to form at least one embedded electronic component. Once the electronic component is embedded in the PCB structure, the plurality of copper traces on each conductive layer can route signals or power to or from selected electrodes in the PCB structure.

It will be appreciated that the spacing between each of the vertically-aligned electrode rings of the PCB structure of the present invention depends on a number of factors. These factors include the number of PCB layers (insulating and pre-preg) of the multi-layer PCB used to fabricate the PCB structure, the thickness of each of these layers, and the depth of plating that is removed from a via during the fabrication process.

In an embodiment where an embedded resistor is to be formed in the PCB structure of the invention, for a given electrical resistivity of the electronically active material used to fill or coat the via and a given diameter of the via, the vertical spacing between the electrodes in the via dictates the resistance of the resistor which is formed by inserting or coating the resistive material in the via. This resistance is proportional to the spacing between electrodes. Thus, a greater vertical separation between the plated electrode rings in the via results in a larger resistance. Similarly, in an embodiment where an embedded capacitor is to be formed in the PCB structure, the capacitance of a capacitor which is formed by filling a dielectric material into the via is inversely proportional to the distance between vertically aligned electrode rings in the via.

In the embodiment of the invention where three or more electrodes are created in a PCB via, different electronically active materials can be stacked, in order to create an embedded circuit. One exemplary process for embedding a passive circuit in the exemplary PCB structure of FIG. 4 which has three electrodes will now be described. In the initial step of this process, the PCB via is partially filled or coated from conductive layers 11 to 14 with a first electronically active material. A second electronically active material is then filled or coated on top or above of the first electronically active material such that it spans conductive layers 1 to 11. Both electronically active materials are then in electrical contact with each other, as well as with the inner electrode, which is connected to trace(s) on conductive layer 10 and/or conductive layer 11. The other end of the first electronically active material is in contact with the lower electrode, which is connected to trace(s) on layers 13 and/or 14, while the other end of the second electronically active material is in contact with the upper electrode, which is connected to trace(s) on one or more of layers 1 to 9. If the first electronically active material is electrically resistive and the second material is a dielectric (or vice versa) for example, an RC (resistor-capacitor) filter circuit is then formed in the PCB structure of the invention.

It will be appreciated that the above RC filter circuit is only one of the many possible embedded circuits that can be constructed with the PCB structure of the present invention. For example, the embodiment of the PCB structure of the invention which has more than two electrodes allows for the stacking of different electronically active materials, such that one or more of them could be heated to stabilise the temperature of the others, outgas a gas sensor element, or null a temperature effect. The combination of circuit possibilities will also increase proportional to the number of inner electrodes and/or electronically active materials used.

Elements such as sensors and actuators work on the basis of a cause and effect principle. This means that a causal stimulus induces some measurable change in a material, which can be mathematically expressed as follows:

Effect Parameter=Property Coefficient×Causal Parameter where these parameters and coefficients are tensors.

One example of such a relationship is Ohm's Law in an isotropic material:

$$I=\sigma V$$

where I is the current (the effect), $\sigma$ is the conductivity (property coefficient), and V is the applied voltage (the cause).

Another example is the piezoelectric effect in an anisotropic poled piezoelectric ceramic, where the electronic polarisation, $P_i$, (the effect) is given by the piezoelectric coefficient tensor of rank 3, $d_{ijk}$ times the stress tensor, and $\sigma_{jk}$ (the cause) is described by:

$$P_i=d_{ijk}\sigma_{jk}$$

Another example of such a relationship is the thermal expansion in an anisotropic material, where the application of heat can cause a strain or expansion in the material such as in a thermally actuated device. The effect of thermal expansion is given by:

$$\Delta\varepsilon_{ij}=\alpha_{ij}\times\Delta T$$

where $\Delta\varepsilon_{ij}$ is the strain tensor of rank 2 (the effect), $\alpha_{ij}$ is the thermal expansion coefficient tensor of rank 2, and $\Delta T$ is the change in temperature (scalar).

Thus, it will be appreciated that in one embodiment of the invention the inner wall of the via can be coated in an electronically active material which comprises a material whose properties change due to a physical stimulus. These properties include, but are not limited to, electrical, electronic, optical or physical properties. In another embodiment of the invention, the inner wall of the via can be coated in an electronically active material which comprises a material whose physical state changes due to an electrical stimulus. Examples of such materials comprise piezoelectric materials, magnetic materials, photo-luminescent materials, and phase-change materials.

The PCB structure of the present invention can therefore be used to create embedded electronic components and circuits which can be used in a number of different applications, such as for example as a sensor platform, as a high-power/high-voltage component array platform, as a transducer and to integrate passive components beneath ICs. An example of how the PCB structure of the present invention could be used in some of these applications is described below.

Sensor Platform:

In the case where the PCB structure of the present invention is to be used to provide a sensor platform, and using the exemplary embodiment of the PCB structure of the invention shown in FIG. 3, in order to create a sensor from the PCB structure, the PCB via can be partially filled from layers 7 to 12 with a material that changes its electrical properties on exposure to an analyte. The top unfilled portion of the via that remains (spanning layers 1 to 7) then can act as a chamber that can be used to hold the analyte.

Alternatively, the inner wall of the via can be partially or completely coated with the material, such that the material surrounds the analyte, thereby allowing interaction between the two over a greater surface area. Since the analyte can come into direct contact with the electronically active material, the composition of the electronically active material can be formulated such that it changes its electrical properties in a predictable manner in response to an interaction with the analyte. Where the PCB structure comprises a plurality of vias in the form of an array, each via in the array can be filled or coated with a different material composition, such that a spectral response is obtained for different constituents of the same analyte to yield an electronic 'fingerprint' for the analyte.

By passing a current through the electronically active material, joule heating could further be used to promote the interaction with the analyte and/or purge the analyte in readiness for a subsequent sampling regime. Highly resistive or capacitive/dielectric sensor materials that cannot self-heat by passing an electrical current through them could alternatively be heated by a separate resistive heater embedded directly beneath the sensor material.

For gaseous analytes, the resultant sensor platform could constitute a sensor head for an electronic nose. For liquid analytes, the resultant sensor platform could constitute a sensor head for an electronic tongue.

High-Power/High-Voltage Component Array Platform:

In the case where the PCB structure of the present invention is to be used to provide a High-Power/High-Voltage Component Array Platform, and using the exemplary embodiment of the PCB structure of the invention shown in FIG. 3, in order to create the platform from the PCB structure, each PCB via in the PCB structure can be completely filled from layers 1 to 12 with an electrically resistive material. For a given PCB surface area, it will be appreciated that the vertical arrangement of resistors facilitated by the PCB structure of the present invention allows a greater volume of material to be used for each resistor, thereby increasing the power-handling capabilities of the resultant embedded resistor well beyond that possible with planar topologies, and therefore also its power-density capabilities. The same holds true with regard to the voltage breakdown capabilities of this embedded resistor. It will be appreciated that fill or coating materials with any other desired electronic properties could be used to produce embedded components other than resistors.

Integration of Passive Components Beneath ICs:

In the case where the PCB structure of the present invention is to be used to provide for the integration of passive components beneath ICs, and using the exemplary embodiment of the PCB structure of the invention shown in FIG. 3, this can be achieved by fabricating a PCB structure comprising an array of vias which are configured to have a pitch that corresponds to that of a BGA IC. Each PCB via can then be filled from layers 2 to 12 with an electrically resistive material. Then, by using a stencil to fill the vacant part of each via (layers 1 to 2) with solder paste, a BGA IC can be soldered directly onto the array using conventional techniques. Components such as termination resistors, pull-up resistors and pull-down resistors can then be directly connected to some or all 'pins' of the IC. It should be noted that in this application, the vertical distance between each of the layers could be equal. It will be appreciated that the PCB structure shown in FIG. 3 is only one example of the PCB structure which could be used in this application, and that a PCB structure containing fewer or more layers than the number of layers shown in FIG. 3 could equally well be used.

Given the typical inaccessibility of central BGA pins, through integrating the PCB structure of the present invention with an IC, superior performance in circuits that benefit from the close proximity of components to the signal pins of an IC can be achieved (such as for example microprocessors and radio-frequency chips). This layout approach also has the benefit of requiring a smaller PCB real-estate, compared with conventional approaches that use discrete soldered components.

The present invention provides numerous advantages when compared to existing PCB structures. Firstly, it provides a cost-effective solution for passive electronic components to be vertically fabricated and integrated into a multi-layer PCB, when compared to selective via plating, because it is not necessary to temporarily block holes. It is therefore also easier to control the spacing distance between the upper and lower electrodes.

However, the new fabrication process still benefits from being able to use conventional PCB plating and drilling processes to produce the PCB structure of the invention for embedding one or more electronic components.

When compared to conventional electroless plating which can be used to cap the top and bottom of an insulated via that is already filled with an electrical material, the present invention does not require such an additional plating step. In addition, unlike in capping, the entire PCB structure is complete before filling or coating commences. This offers greater flexibility, because the PCB manufacturer does not have to fill or coat the inside wall of the vias. This also enables the vias to be filled or coated by another party if desired. Furthermore, the use of electrode rings instead of caps relieves thermal stress on the finished embedded component(s) that might arise from any differences between the Thermal Coefficient of Expansion of the PCB and the electronically active materials.

The PCB structure of the present invention also allows one or both ends of components embedded in the PCB structure to be readily exposed, and thus is suitable for use in applications such as sensor applications.

The vertical structure also allows for bulkier embedded components that have a greater power-handling capacity and require a relatively smaller PCB area, when compared to planar solutions that are confined to a single thin layer. The vertical structure can also allow for stacking of embedded components in a single via for use in a wide variety of applications, such as transducer applications.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A printed circuit board (PCB) structure for forming at least one embedded printed electronic component comprising:
   a multi-layer PCB board comprising at least one through-hole via comprising an inner wall, the via comprising:
   a plurality of electrodes vertically aligned within the via, each electrode comprising a plated ring; and
   an isolation section separating each of the electrodes,
   wherein the inner wall of the via is provided with a coating of one or more electronically active materials, such that each electronically active material makes electrical contact with at least two electrodes of the plurality of electrodes to form the at least one embedded printed electronic component, and
   wherein the one or more electronically active materials comprise a material whose properties change due to a physical stimulus or a material whose physical state changes due to an electrical stimulus.

2. The PCB structure of claim 1, wherein the through-hole via comprises one or more stepped-holes.

3. The PCB structure of claim 1, wherein the inner wall of the via is partially coated with the one or more electronically active materials.

4. The PCB structure of claim 1, wherein the one or more electronically active materials comprise one or more of: a conductor, a semiconductor and a dielectric.

5. The PCB structure of claim 1, wherein the properties comprise: electrical, electronic, optical or physical properties.

6. The PCB structure of claim 1, wherein the one or more electronically active materials comprise one or more of: piezoelectric materials, magnetic materials, photo-luminescent materials and phase-change materials.

7. The PCB structure of claim 1, wherein each of the one or more electronically active materials takes the form of an ink, a paste, a resin, or an adhesive.

8. The PCB structure of claim 1, wherein the thickness of the coating of the one or more electronically active materials is less than the radius of the via.

9. A method of fabricating a printed circuit board (PCB) structure for embedding at least one printed electronic component, the method comprising:
   forming a multi-layer PCB, printed circuit board, comprising:
   an upper PCB section, a lower PCB section, and an intermediate PCB section between the upper PCB section and the lower PCB section;
   boring a through-hole of a first diameter in the multi-layer PCB;
   counter-boring a hole of a second diameter from the hole in the lower PCB section to a height marginally greater than the lower PCB section and/or counter-boring a hole of the second diameter from the hole in the upper PCB section to a depth marginally greater than the upper PCB section, wherein the second diameter is greater than the first diameter;
   plating the inner wall of the bored hole to form a via; and
   selectively removing at least one band of plating from the via so as to create a plurality of vertically aligned electrodes within the via, each electrode comprising a plated ring, and each electrode separated by an isolation section;
   wherein the step of selectively removing at least one band of plating from the via comprises:
   back-drilling a hole of a third diameter from at least one counter-bored via to at least one predetermined depth of the PCB, wherein the third diameter is greater than the first diameter and less that the second diameter,
   wherein the method further comprises the step of coating the inner wall of the via with one or more electronically active materials such that each electronically active material makes electrical contact with at least two electrodes of the plurality of electrodes to form the at least one embedded printed electronic component, and
   wherein the one or more electronically active materials comprise a material whose properties change due to a physical stimulus or a material whose physical state changes due to an electrical stimulus.

10. The method of claim 9 further comprising performing in a single step the steps of:
    boring the through-hole of the first diameter in the multi-layer PCB; and
    counter-boring the hole of the second diameter from the hole in the lower PCB section or from the hole in the upper PCB section.

11. The method of claim 9, wherein the via in the lower PCB section is counter-bored, and further comprising performing the back-drilling of the hole of the third diameter from the counter-bored via in the lower PCB section, wherein the back-drilling comprises back-drilling to a height marginally less than the upper PCB section.

12. The method of claim 9, wherein the via in the upper PCB section is counter-bored, and further comprising performing the back-drilling of the hole of the third diameter from the counter-bored via in the upper PCB section, wherein the back-drilling comprises back-drilling to a depth marginally less than the lower PCB section.

13. The method of claim 9, wherein the via in the upper PCB section is counter-bored and the via in the lower PCB section is counter-bored, and further comprising:
    performing the back-drilling of the hole of the third diameter from the counter-bored via in the upper PCB section and from the counter-bored via in the lower PCB section, wherein the back-drilling comprises back-drilling to a plurality of predetermined depths of the PCB.

14. The method of claim 9, wherein the one or more electronically active materials comprise one or more of: a conductor, a semiconductor and a dielectric.

15. The method of claim 9, wherein the properties comprise electrical, electronic, optical or physical properties.

16. The method of any of claim 9, wherein the thickness of the coating of the one or more electronically active materials is less than the radius of the via.

* * * * *